US009653629B2

(12) United States Patent
Yim et al.

(10) Patent No.: US 9,653,629 B2
(45) Date of Patent: *May 16, 2017

(54) SUBSTRATE MATERIAL OF IRON-NICKEL ALLOY METAL FOIL FOR CIGS SOLAR CELLS

(75) Inventors: Tai Hong Yim, Gyeonggi-Do (KR); Heung Yeol Lee, Gyeonggi-Do (KR); Tae Jin Hwang, Incheon (KR); Young Sik Song, Incheon (KR); Yong Ki Cho, Gyeonggi-Do (KR); Min Su Lee, Gyeonggi-Do (KR); Yoon Ho Han, Incheon (KR)

(73) Assignee: KOREA INSTITUTE OF INDUSTRIAL TECHNOLOGY, Chungcheongnam-do (KR)

( * ) Notice: Subject to any disclaimer, the term of this patent is extended or adjusted under 35 U.S.C. 154(b) by 265 days.

This patent is subject to a terminal disclaimer.

(21) Appl. No.: 14/358,445

(22) PCT Filed: Dec. 28, 2011

(86) PCT No.: PCT/KR2011/010222
§ 371 (c)(1),
(2), (4) Date: Aug. 7, 2014

(87) PCT Pub. No.: WO2013/073738
PCT Pub. Date: May 23, 2013

(65) Prior Publication Data
US 2014/0345677 A1     Nov. 27, 2014

(30) Foreign Application Priority Data

Nov. 16, 2011 (KR) .................. 10-2011-0119595

(51) Int. Cl.
*C22C 38/08* (2006.01)
*C22C 19/03* (2006.01)
(Continued)

(52) U.S. Cl.
CPC .......... *H01L 31/0352* (2013.01); *C22C 19/03* (2013.01); *C22C 30/00* (2013.01);
(Continued)

(58) Field of Classification Search
None
See application file for complete search history.

(56) References Cited

U.S. PATENT DOCUMENTS

| 5,986,205 | A | 11/1999 | Matsune et al. |
| 6,040,520 | A | 3/2000 | Morooka |

(Continued)

FOREIGN PATENT DOCUMENTS

| CN | 1836338 | 2/2006 |
| JP | 6-75489 | 3/1994 |

(Continued)

OTHER PUBLICATIONS

Machine-English translation of Korean unexamined patent publication No. 10-2009-0036713, Sin-Cheol Gang et al., Apr. 15, 2009.*

(Continued)

*Primary Examiner* — Deborah Yee
(74) *Attorney, Agent, or Firm* — Nixon & Vanderhye P.C.

(57) ABSTRACT

The present invention relates to an exclusive alloy substrate material for CIGS solar cells. Particularly, the present invention provides a substrate material having a thermal expansion coefficient similar to that of a CIGS layer. The substrate material according to the present invention may prevent damage such as interlayer separation due to differing thermal expansion coefficients from occurring because the substrate material has a thermal expansion coefficient similar to that of the CIGS layer.

4 Claims, 6 Drawing Sheets

(51) Int. Cl.
    *C21D 1/04*     (2006.01)
    *H01L 31/0392*  (2006.01)
    *H01L 31/032*   (2006.01)
    *H01L 31/0352*  (2006.01)
    *C22C 30/00*    (2006.01)
    *C25D 1/04*     (2006.01)

(52) U.S. Cl.
    CPC ............ *C22C 38/08* (2013.01); *C25D 1/04* (2013.01); *H01L 31/0322* (2013.01); *H01L 31/03928* (2013.01); *Y02E 10/541* (2013.01); *Y02P 70/521* (2015.11)

(56) References Cited

U.S. PATENT DOCUMENTS

| | | | |
|---|---|---|---|
| 6,428,672 | B1 | 8/2002 | Choi |
| 7,374,963 | B2 | 5/2008 | Basol |
| 7,582,506 | B2 | 9/2009 | Basol |
| 7,713,773 | B2 | 5/2010 | Basol |
| 7,736,940 | B2 | 6/2010 | Basol |
| 7,833,821 | B2 | 11/2010 | Basol |
| 7,854,963 | B2 | 12/2010 | Basol |
| 8,008,113 | B2 | 8/2011 | Basol |
| 8,187,904 | B2 | 5/2012 | Basol |
| 8,192,594 | B2 | 6/2012 | Basol |
| 8,323,735 | B2 | 12/2012 | Basol |
| 2005/0202589 | A1 | 9/2005 | Basol |
| 2006/0121701 | A1 | 6/2006 | Basol |
| 2007/0093006 | A1 | 4/2007 | Basol |
| 2007/0093059 | A1 | 4/2007 | Basol |
| 2007/0111367 | A1 | 5/2007 | Basol |
| 2007/0145507 | A1 | 6/2007 | Basol |
| 2007/0166964 | A1 | 7/2007 | Basol |
| 2008/0023059 | A1 | 1/2008 | Basol |
| 2008/0096307 | A1 | 4/2008 | Basol |
| 2008/0175993 | A1 | 7/2008 | Ashjaee et al. |
| 2008/0190761 | A1 | 8/2008 | Basol |
| 2008/0257404 | A1* | 10/2008 | Schuisky ............ H01L 31/0322 136/255 |
| 2009/0162969 | A1 | 6/2009 | Basol |
| 2009/0183675 | A1 | 7/2009 | Basol |
| 2009/0314649 | A1 | 12/2009 | Basol |
| 2010/0015754 | A1 | 1/2010 | Basol |
| 2010/0139557 | A1 | 6/2010 | Basol |
| 2010/0226629 | A1 | 9/2010 | Basol |
| 2010/0229940 | A1 | 9/2010 | Basol |
| 2010/0269906 | A1 | 10/2010 | Ota et al. |
| 2010/0317144 | A1 | 12/2010 | Basol |
| 2011/0011340 | A1 | 1/2011 | Basol |
| 2014/0332069 | A1 | 11/2014 | Yim et al. |

FOREIGN PATENT DOCUMENTS

| | | |
|---|---|---|
| JP | 10-082000 | 3/1998 |
| JP | 2009-021479 | 1/2009 |
| JP | 2011-511477 | 4/2011 |
| KR | 10-1998-0087070 | 12/1998 |
| KR | 10-1999-0064747 | 8/1999 |
| KR | 10-2001-0022951 | 3/2001 |
| KR | 10-2009-0036713 | 4/2009 |
| WO | WO 2005/015645 A1 | 2/2005 |

OTHER PUBLICATIONS

International Search Report for PCT/KR2011/010222, mailed Oct. 29, 2012.
Office Action of CN 201180074731.5 dated Jun. 30, 2015 (Applicant: Korea Institute of Industrial Technology; "Substrate material of iron-nickel alloy metal foil for cigs solar cells") (including English translation).
Office Action of CN 201180074731.5 dated Mar. 9, 2016 (Applicant: Korea Institute of Industrial Technology; "Substrate material of iron-nickel alloy metal foil for cigs solar cells") (including English translation).
International Search Report dated Mar. 25, 2013, issued in connection with PCT/KR2012/008429, Applicant: Korea Institute of Industrial Technology, Inventor(s): Tai Hong Yim et al, Title: Controlled Expansion Flexible Metal Substrate Material Having a Textured Structure.
Kessler et al. "Technological aspects of flexible CIGS solar cells and modules" Solar Energy 77 (2004) 685-695.
U.S. Patent Office, Office Action dated Jan. 13, 2017 in U.S. Appl. No. 14/358,138 (Yim, filed May 14, 2014, Title: Controlled Expansion Flexible Metal Substrate Material Having a Textured Structure) citing U.S. Pat. No. 6,599,411 (Dinan) and KR1020090036713 (Kang—English translation).

* cited by examiner

SUBSTRATE MATERIAL OF IRON-NICKEL ALLOY METAL FOIL FOR CIGS SOLAR CELLS

This application is the U.S. national phase of International Application No. PCT/KR2011/010222, filed 28 Dec. 2011, which designated the U.S. and claims priority to KR Application No. 10-2011-0119595, filed 16 Nov. 2011, the entire contents of each of which are hereby incorporated by reference.

TECHNICAL FIELD

The present invention relates to an alloy metal foil substrate material for a Cu—In—Se (CIS) or Cu—In—Ga—Se (CIGS) solar cell, and more particularly to a substrate material which can be used as a substrate material for a flexible CIGS solar cell and is made of an Fe—Ni alloy foil while having a thermal expansion behavior similar to that of a CIGS compound semiconductor.

BACKGROUND ART

A CIS solar cell and a CIGS solar cell are thin film solar cells that comprise three elements (Cu, In and Se) and four elements (Cu, In, Ga and Se), respectively. The CIGS solar cells have higher photoelectric conversion efficiency than Si thin-film solar cells, and the related markets are expected to grow in the future. Generally, the CIGS solar cells have a structure such as substrate/Mo electrode/CIGS/CdS/TCO. The substrate is made of, for example, a plastic, glass or metal foil (thin metal substrate) material, and is selected in consideration of suitability for fabrication processes, and properties such as flexibility.

Glass substrates are transparent and are flexible when processed to have a thin thickness, but are difficult to handle. Plastic substrates have low heat resistance, and thus special processes such as low-temperature vapor deposition should be applied thereto.

Meanwhile, in the case in which a solar cell is to be fabricated on a stainless steel foil (thin stainless substrate material) or plastic substrate, when heat is applied to the substrate during vapor deposition or in the thin-film cell layer formation and selenization processes, there may be a problem in that interlayer separation occurs, because the substrate and the CIGS layer have different thermal expansion coefficients.

To overcome this problem, a substrate having a thermal expansion coefficient similar to that of the CIGS layer is preferably used, and for this reason, a specific metal foil may be selected as the substrate material. A metal foil can be rendered flexible when processed to have a thin thickness. In addition, it has high heat resistance that eliminates the need to design a low-temperature deposition process. Accordingly, a substrate made of an alloy material found to have a thermal expansion coefficient similar to that of CIGS will have various advantages.

Various methods can be used to manufacture metal foils, and among them, rolling technology is frequently used. The rolling technology is a technology of processing a metal foil using 20-stage rolling rolls. This technology has limitations in increasing the width of the metal substrate material being processed, and thus is disadvantageous for producing a large-area substrate using a large-area production process with reduced production costs. In addition, it is generally difficult for this technology to obtain a substrate material having a thickness of 0.1 mm or less.

DISCLOSURE

Technical Problem

Therefore, it is an object of the present invention to provide a large-width metal foil substrate material, which is produced by an electroforming process, has a thermal expansion coefficient similar to that of a CIGS layer and shows excellent strength and flexibility properties compared to those of a metal foil produced by a conventional rolling process. Another object of the present invention is to provide a metal foil substrate material having a thin thickness of 1-100 that makes it easy to handle the substrate material.

Technical Solution

To achieve the above objects, in accordance with a preferred embodiment of the present invention, there is provided an Fe—Ni alloy metal foil substrate material for a CIGS solar cell, wherein the Fe—Ni alloy metal foil substrate material has a grain size ranging from 0.1 μm to 10 μm and a thermal expansion coefficient ranging from $6 \times 10^{-6}/°$C. to $12 \times 10^{-6}/°$C.

In another embodiment of the present invention, the Fe—Ni alloy metal foil substrate material may be composed of Fe-45 to 55 wt % Ni.

In still another preferred embodiment of the present invention, the Fe—Ni alloy metal foil substrate material may have a thickness between 1 μm and 100 μM.

In accordance with still another preferred embodiment of the present invention, there is provided a method for producing an Fe—Ni alloy metal foil substrate material for a CIGS solar cell, the method including the steps of: producing an Fe—Ni alloy metal foil by an electroforming process using an electrode; and stabilizing the structure of the Fe—Ni metal foil by heat-treating the metal foil.

In still another preferred embodiment of the present invention, the step of stabilizing the structure may be performed at a temperature between 400° C. and 1000° C. for 30 minutes to 2 hours.

In still another preferred embodiment of the present invention, the width of the Fe—Ni alloy metal foil substrate material may be determined by the width of the electrode.

In still another preferred embodiment of the present invention, the thickness of the Fe—Ni alloy metal foil substrate material may be controlled by the rotating speed of the electrode.

Advantageous Effects

The Fe—Ni alloy metal foil substrate material produced according to the present invention has a thermal expansion coefficient similar to that of CIS or CIGS. Thus, when it is used as a substrate for a solar cell, a solar cell fabrication process does not require a special process design, and even after fabrication of the solar cell, interlayer separation caused by thermal expansion in the solar cells does not occur.

In addition, the present invention employs an electroforming technique that utilizes a simple process system, unlike a rolling process. Thus, the present invention makes it possible to produce a metal foil substrate material that is wide, thin and flexible.

BEST MODE

The Fe—Ni alloy metal foil substrate material of the present invention is characterized in that it is produced by an electroforming technique, and then subjected to a structure stabilization process, and as a result, has a thermal expansion coefficient and grain size suitable for its use in a solar cell. As used herein, the term "structure stabilization process" refers to a process that changes an energy-unstable nano-sized grain structure to a stable micro-sized grain structure. This process comprises heat-treating the substrate material at a temperature between 400° C. and 1000° C. for 30 minutes to 2 hours.

The Fe—Ni alloy metal foil substrate material of the present invention has a thermal expansion coefficient of $6\times10^{-6}$ to $12\times0^{-6}/°$ C., and preferably $7\times10^{-6}$ to $10\times10^{-6}/°$ C.

The thermal expansion coefficient of the substrate material is similar to that of a CIS or CIGS layer that is used in a CIGS solar cell. Because of this similar thermal expansion coefficient, it is possible to prevent the occurrence of interlayer separation or cracking caused by stress during the fabrication of a solar cell module comprising the CIGS layer coming into contact with the substrate or during the use of the solar cell after fabrication, thereby preventing the reduction in the life span of the solar cell.

The present inventors have conducted extensive studies to develop a metal foil having the thermal expansion coefficient as described above, and as a result, have found that the composition of the alloy metal foil, substrate material, is most preferably Fe-45 to 55 wt % Ni. As used herein, the expression "Fe-45 to 55 wt % Ni" means that the content of Ni in the total alloy composition ranges from 45 wt % to 55 wt %. The substrate material for a CIGS solar cell is composed of Fe-45 to 55 wt % Ni, which makes it possible to prevent damage to the solar cell, which results from thermal expansion.

Figure 1:
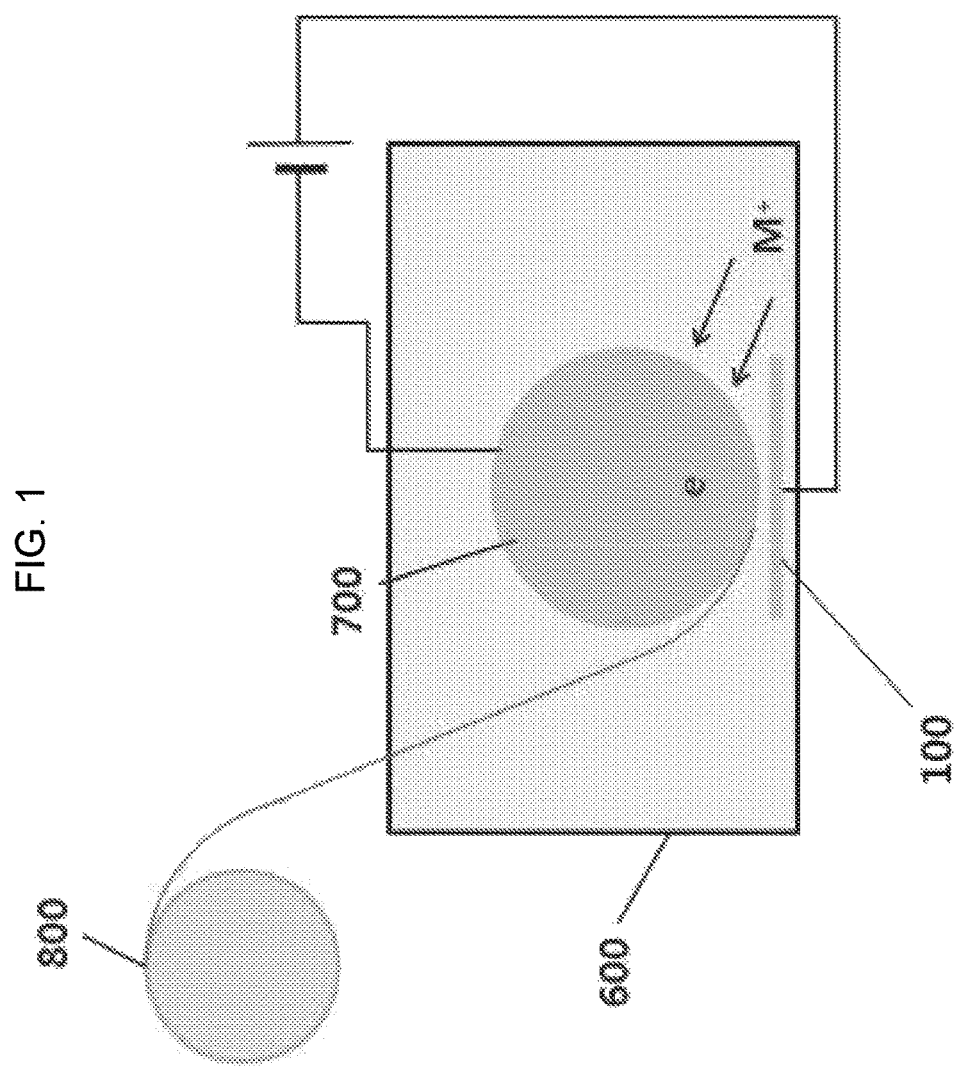
FIG. 1 is a schematic view showing a method for producing an Fe—Ni alloy metal foil substrate material according to an embodiment of the present invention.
Figure 2:
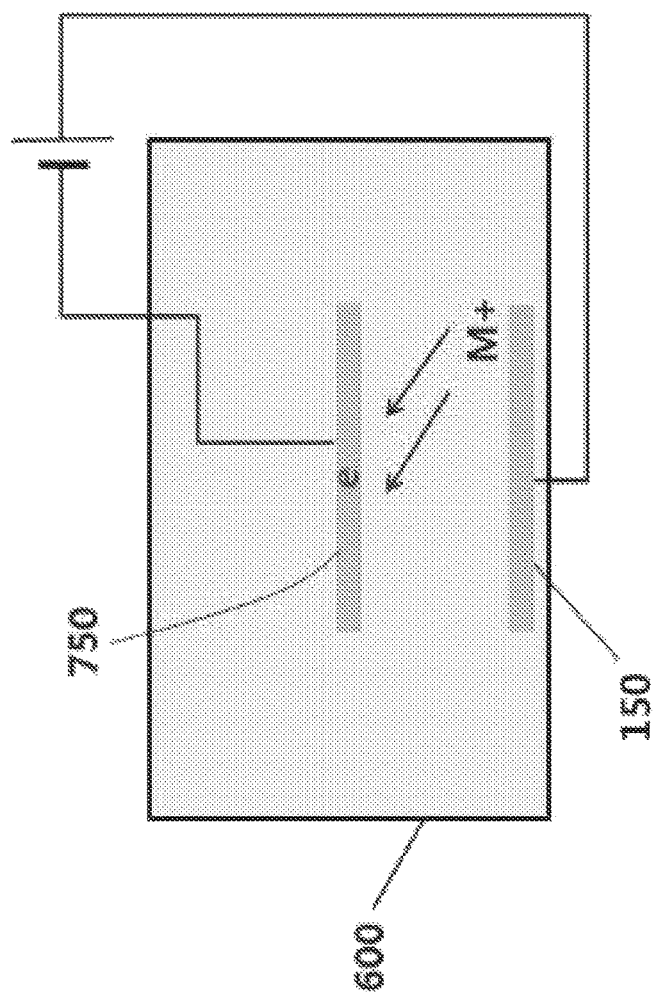
FIG. 2 is a schematic view showing a method for producing an Fe—Ni alloy metal foil substrate material according to another embodiment of the present invention.

The Fe—Ni alloy metal foil substrate material having the above-described composition can be produced by an electroforming process. FIGS. 1 and 2 schematically show processes of producing an Fe—Ni alloy metal foil substrate material by an electroforming process according to the present invention. Hereinafter, a process for producing an Fe—Ni alloy metal foil substrate material according to the present invention will be described with reference to the accompanying drawings.

Referring to FIG. 1, the alloy metal foil substrate material of the present invention is produced by the so-called electroforming process. Specifically, an electrolyte solution is filled in an electrolytic cell 600 made of an electrically conductive metal such as SUS, and a negative electrode 700 and a positive electrode 100, which have an electrically conductive metal surface, are immersed in the electrolyte solution. When a voltage is applied to the positive electrode 100 and the negative electrode 700, a metal is deposited on the surface of the negative electrode 700 according to the electroplating principle, thereby producing the substrate material.

The negative electrode 700 is connected to the negative (−) pole of a voltage source, and the positive electrode is connected to the positive (+) pole of the voltage source. An electrolyte solution containing metal ions to be plated is filled in the electrolytic cell 600. In this case, the metal foil formed by electroforming can be made of a desired alloy material determined depending on the composition of the electrolyte solution.

The electrolyte solution is prepared by mixing an iron-containing salt with a nickel-containing salt. For example, the electrolyte solution may contain iron sulfate, ferrous chloride, nickel sulfate, nickel chloride, nickel sulfamate and the like. More preferably, the electrolyte solution contains iron sulfate and nickel chloride.

In order to obtain an alloy composition of Fe-45 to 55 wt % Ni, the electrolyte solution preferably contains 100-300 g/L of nickel sulfamate and 10-30 g/L of iron chloride. The electrolyte solution is controlled to a pH of 2.5-3.5, a temperature of 45~60° C. and a current density of 50-120 mA/cm². However, the conditions related to the electrolyte solution can be suitably controlled according to circumstances.

In addition to the electrolyte, additives such as a brightener, a stress-relieving agent and a pH-buffering agent are preferably added. Preferably, the electrolyte solution contains 1-10 g/L of saccharin, 0.1-5 g/L of ascorbic acid, 10-40 g/L of boronic acid, and 0.1-5 g/L of sodium lauryl sulfate.

The electrode 700 may have a drum shape and may be rotated at a predetermined speed, and the metal foil formed by electroplating can be recovered in a simple manner by winding it around a collection roller 800 disposed outside the electrolytic cell 600. The rotating speed of the electrode 700 is associated with the thickness of the metal foil to be formed, and the thickness of the metal foil can be controlled in the range of 1 to 100 The thickness of the metal foil can be controlled to a desired thickness by controlling the rotating speed of the negative electrode drum for depending on the size of the negative electrode drum and the current density. In the present invention, the thickness of the Fe—Ni metal foil substrate material is preferably 1-100 μm, and preferably 10-50 μm. If the thickness of the substrate material is 100 μm or more, the application of the substrate material will not be problematic, but productivity will be reduced. The substrate material having the above-described thickness range can provide a flexible substrate for a solar cell, which can be flexibly applied to a building integrated photovoltaic (BIPV) system or the like. In addition, the width of the metal foil that is produced by the electroforming process can be increased to a desired level by increasing the width of the electrode 700, suggesting that the electroforming process is advantageous over the rolling process.

Although the continuous production method based on the roll-to-roll process has been illustrated above, the roll-to-roll process does not necessarily need to be used. In other words, as shown in FIG. 2, a plate-type electrode 750 connected to a negative (−) pole and a plate-type electrode 150 connected to a positive (+) pole are immersed in an electrolytic cell 600, and in this state, a flexible metal foil can be produced by a batch process. Even when the batch process is used, a metal foil having a desired large width and thin thickness can be produced.

The large-width thin metal foil as described above can be used as a substrate for fabricating a solar cell or a display device. Particularly, it can be consistent with the desire to produce a device using a large-area substrate with increased productivity and reduced costs.

In the present invention, the grain size of the metal foil substrate material is preferably 0.1-10 µm, and more preferably 0.1-5 µm. The metal foil substrate material produced by the electroforming process is a nanocrystalline material having a grain size of about 10-30 nm. This nanocrystalline material has high mechanical properties compared to a bulk material having the same composition, which is produced by a conventional rolling process. However, it has a problem in that it shows a rapid change in the thermal expansion behavior due to a change in the structure thereof at a specific temperature. This rapid change in the thermal expansion behavior can cause problems in a process of depositing CIGS at high temperature, and for this reason, a process of stabilising the structure is required.

To overcome this problem, in the present invention, the metal foil produced by the electroforming process was subjected to a structure stabilization process by heat-treating the produced metal foil at a temperature of 400~1000° C. for 30 minutes to 2 hours.

Particularly, through the structure stabilization, process, the nano-sized grain size of the metal foil was increased to a grain size of 0.1-10 µm, and thus the metal foil showed a uniform thermal expansion behavior. As the size of grains in the stabilized structure of the metal foil increases, the tensile strength of the metal foil decreases, but the flexibility of the metal foil increases, suggesting that the metal foil having the stabilized structure can be advantageously used as a substrate material for a flexible CIGS solar cell. However, the substrate material having an increased grain size also has excellent tensile strength compared to a substrate material produced by a conventional rolling process.

If the grain size of the substrate material is less than 0.1 µm, the thermal expansion coefficient will change rapidly with a change in temperature, suggesting that the substrate material will not have a stable thermal expansion coefficient. If the grain size is more than 10 µm, the strength will decrease, making it difficult to handle the substrate material.

MODE FOR INVENTION

Hereinafter, the present invention will be described in detail with reference to examples, but the scope of the present invention is not restricted or limited to these examples.

Example 1

An alloy metal foil substrate material composed of Fe-46 wt % Ni was produced using an electrolyte solution having the following composition and the electroforming apparatus shown in FIG. 1. Specifically, the electrolyte solution contained 200 g/L of nickel sulfamate, 20 g/L of iron (II) chloride 4-hydrate, 20 g/L of boronic acid, 0.5 g/L of sodium lauryl sulfate, 2 g/L of saccharin and 1 g/L of an antioxidant (ascorbic acid) and had a pH of 3.0. The electrolyte solution was maintained at a temperature of 60° C. and controlled to a current density of 56 mA/cm$^2$, thereby producing a metal foil substrate material composed of Fe-46 wt % Ni and having a thickness of 30 µm. The produced substrate material had a grain size of 15-20 µm. When the produced substrate material was subjected to a structure stabilization process under a hydrogen atmosphere at a temperature of 400~1000° C. for 1 hour, the grain size increased to 0.1-10 µm.

Figure 3:
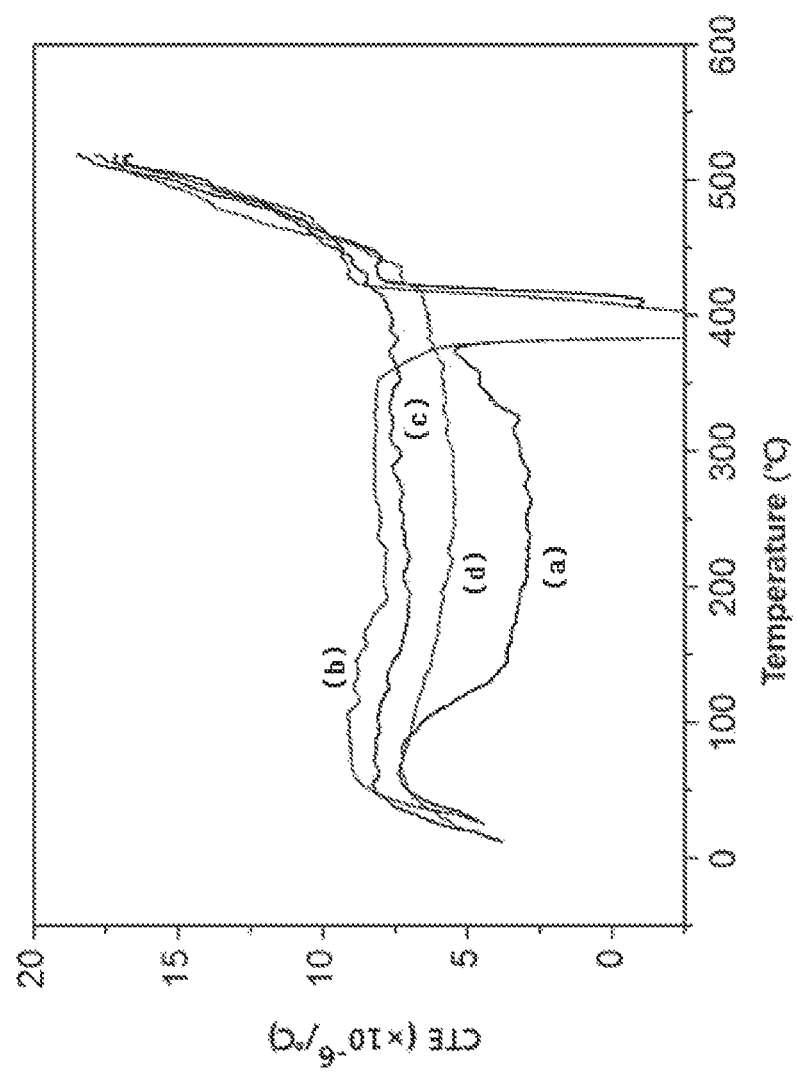
FIG. 3 shows the coefficient of thermal expansion of an alloy metal foil substrate material composed of Fe-46 wt % Ni as a function of the temperature of a structure stabilisation process.

In the cases in which (a) the produced Fe—Ni substrate material was not subjected to a structure stabilization process (heat treatment), (b) it was heat-treated under a hydrogen atmosphere at 400° C. for 1 hour, (c) it was heat-treated under a hydrogen atmosphere at 500° C. for 1 hour, and (d) it was heat-treated under a hydrogen atmosphere at 600° C. for 1 hour, the thermal expansion coefficient of the Fe—Ni metal foil substrate material as a function of the temperature of the structure stabilization process was measured by thermo-mechanical analysis (TMA), and the results of the measurement are shown in FIG. 3. As can be seen in FIG. 3, when the structure stabilization process was performed at 400° C., rapid thermal shrinkage at about 400° C. occurred. However, the structure stabilization process was performed at 600° C., the average of CTEs in the temperature range (20° C. to 500° C.) was $6.85 \times 10^{-6}$/° C.

Example 2

An alloy metal foil substrate material composed of Fe-48 wt % Ni was produced in a manner similar to that described in Example 1 using an electrolyte solution having a composition controlled to provide Fe-48 wt % Ni.

Figure 4:
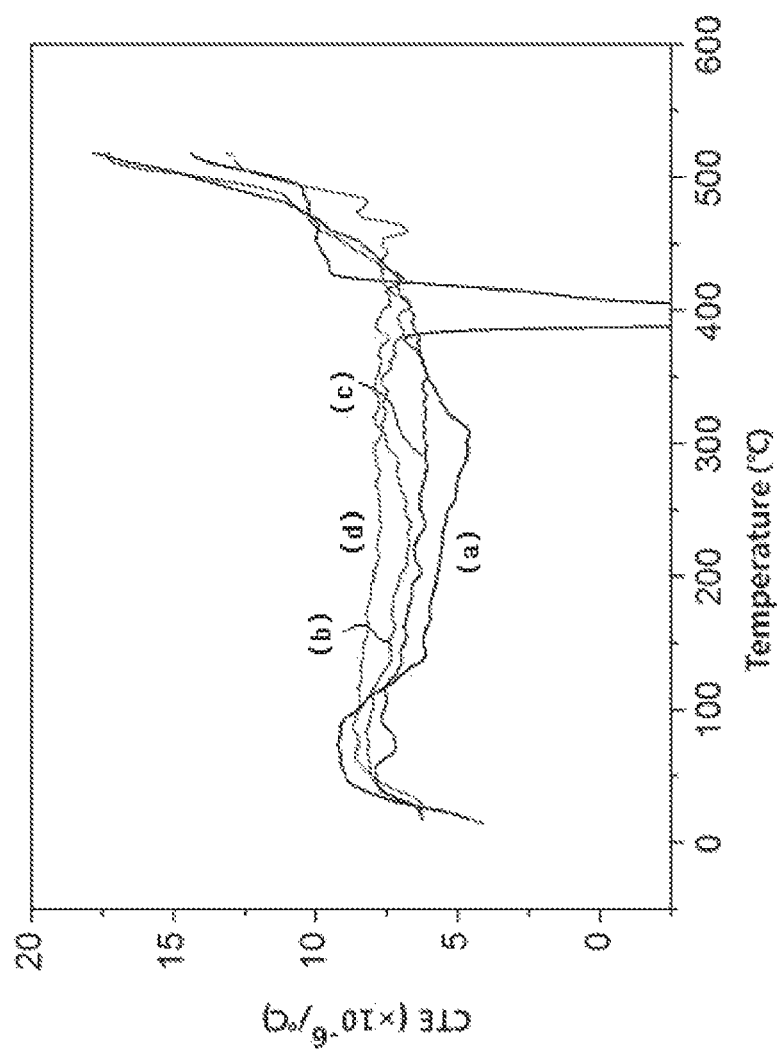
FIG. 4 shows the coefficient of thermal expansion of an alloy metal foil substrate material composed of Fe-48 wt % Ni as a function of the temperature of a structure stabilization process.

In the cases in which (a) the produced Fe—Ni substrate material was not subjected to a structure stabilization process (heat treatment), (b) it was heat-treated under a hydrogen atmosphere at 400° C. for 1 hour, (c) it was heat-treated under a hydrogen atmosphere at 500° C. for 1 hour, and (d) it was heat-treated under a hydrogen atmosphere at 600° C. for 1 hour, the thermal expansion coefficient of the Fe—Ni metal, foil substrate material as a function of the temperature of the structure stabilization process was measured by thermo-mechanical analysis (TMA), and the results of the measurement are shown in FIG. 4. As can be seen in FIG. 4, when the structure stabilization process was performed at 600° C., the average of CTEs in the temperature range (20° C. to 500° C.) was $7.21 \times 10^6$/° C.

Example 3

An alloy metal foil substrate material composed of Fe-50 wt % Ni was produced in a manner similar to that described in Example 1 using an electrolyte solution having a composition controlled to provide Fe-50 wt % Ni.

Figure 5:
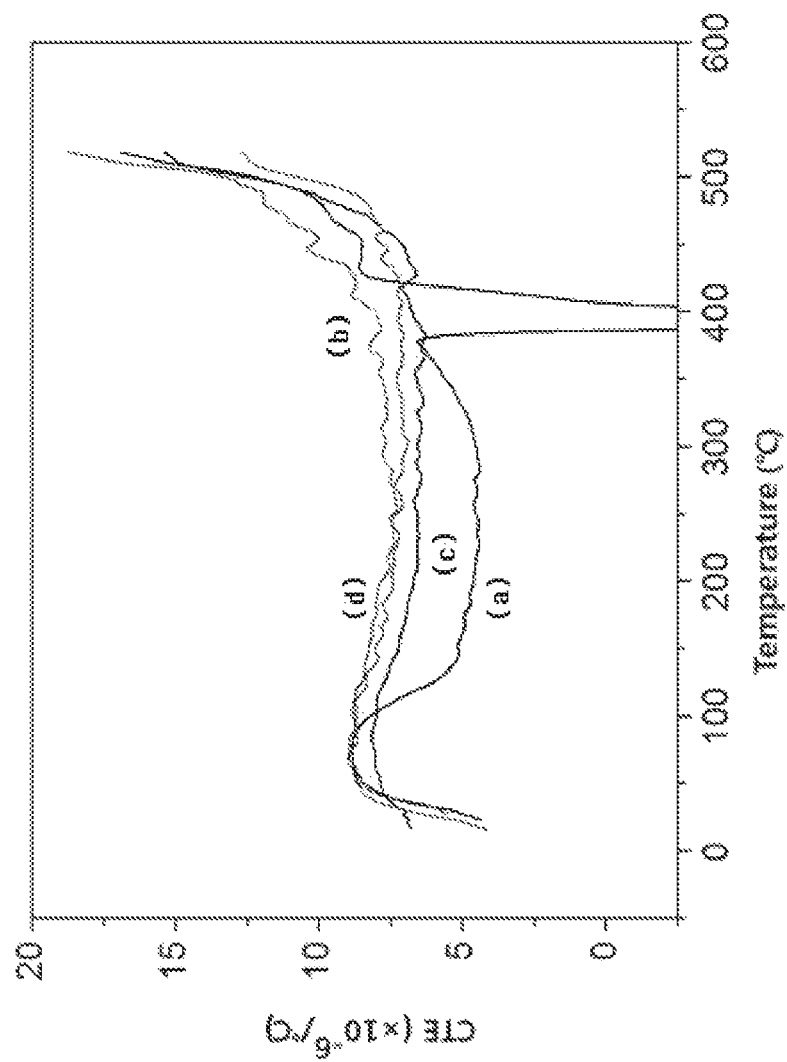
FIG. 5 shows the coefficient of thermal expansion of an alloy metal foil substrate material composed of Fe-50 wt % Ni as a function of the temperature of a structure stabilization process.

In the cases in which (a) the produced Fe—Ni substrate material was not subjected to a structure stabilization process (heat treatment), (b) it was heat-treated under a hydrogen atmosphere at 400° C. for 1 hour, (c) it was heat-treated under a hydrogen atmosphere at 500° C. for 1 hour, and (d) it was heat-treated under a hydrogen atmosphere at 600° C. for 1 hour, the thermal expansion coefficient of the Fe—Ni metal foil substrate material as a function of the temperature of the structure stabilization process was measured by thermo-mechanical analysis (TMA), and the results of the measurement are shown in FIG. 5. As can be seen in FIG. 5, when the structure stabilization process was performed at 600° C., the average of CTEs in the temperature range (20 to 500° C.) was $7.24 \times 10^{-6}$/° C.

Example 4

An alloy metal foil substrate material composed of Fe-52 wt % Ni was produced in a manner similar to that described in Example 1 using an electrolyte solution having a composition controlled to provide Fe-52 wt % Ni.

Figure 6:
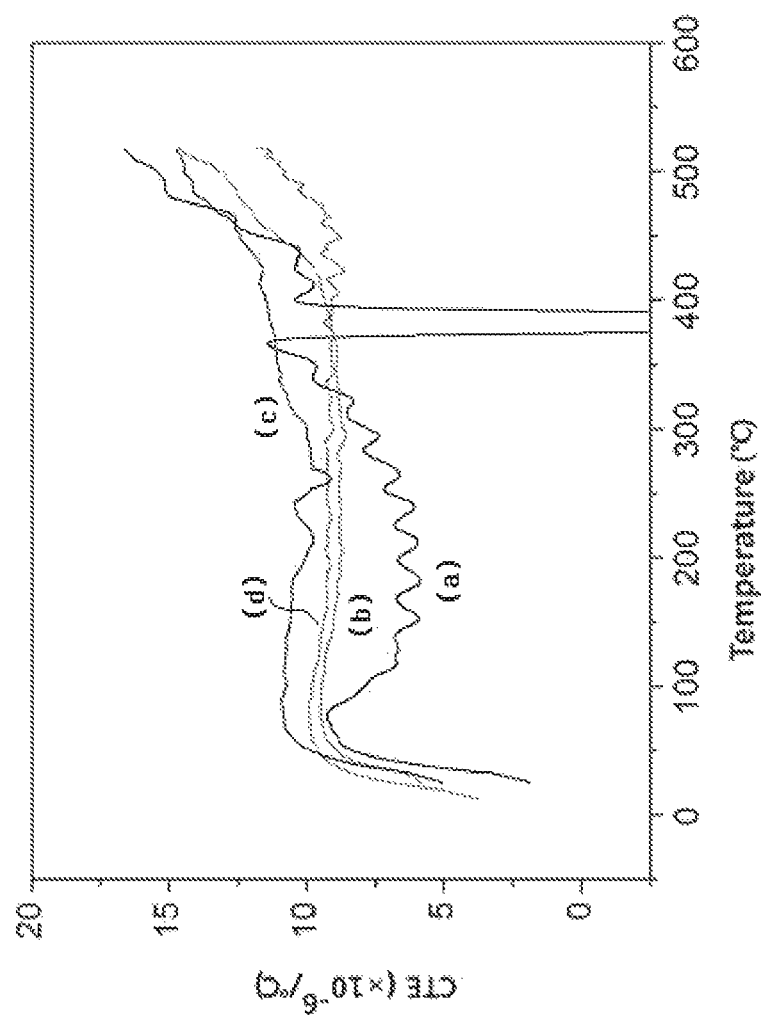
FIG. 6 shows the coefficient of thermal expansion of an alloy metal foil substrate material composed of Fe-52 wt % Ni as a function of the temperature of a structure stabilization process.

In the cases in which (a) the produced Fe—Ni substrate material was not subjected to a structure stabilization process (heat treatment), (b) it was heat-treated under a hydrogen atmosphere at 400° C. for 1 hour, (c) it was heat-treated under a hydrogen atmosphere at 500° C. for 1 hour, and (d) it was heat-treated, under a hydrogen atmosphere at 600° C. for 1 hour, the thermal expansion coefficient of the Fe—Ni metal foil substrate material as a function of the temperature of the structure stabilization process was measured by thermo-mechanical analysis (TMA), and the results of the measurement are shown in FIG. 6. As can be seen in FIG. 6, when the structure stabilization process was performed at 600° C., the average of CTEs in the temperature range (20 to 500° C.) was $10.70 \times 10^{-6}/°$ C.

Test Example 1

Substrate materials having thicknesses of 20 μm and 30 μm were produced using the electrolyte solution composition of Example 4, and the tensile strengths thereof were measured before and after the structure stabilization process.

To measure the tensile strength, a specimen was prepared in accordance with KS B 0801-1981 (metal material tensile specimen; No. 13B), and a tensile test for the specimen, was performed in accordance with KS B 0801-1977 (metal material tensile test method). The specimen had a width of 7 mm, and the tensile test was performed under the following conditions: gauge length: 42 mm; load cell: 2T; and tensile speed: 8 mm/min.

Table 1 below shows the results of the tensile test for (a) a 30-μm thick substrate material not subjected to the structure stabilization process, (b) a 30-μm thick substrate material subjected to the structure stabilization process at 600° C. for 1 hour, (c) a 20-μm thick substrate not subjected to the structure stabilization process, and (d) a 20-μm thick substrate material subjected to the structure stabilization process at 600° C. for 1 hour.

TABLE 1

| Specimen | 30 μm thickness before stabilization | 30 μm thickness after stabilization | 20 μm thickness before stabilization | 20 μm thickness after stabilization |
|---|---|---|---|---|
| 1 | 31.08 | 14.54 | 15.25 | 8.15 |
| 2 | 31.17 | 14.54 | 14.17 | 8.29 |
| 3 | 31.08 | 15.08 | 12.69 | 7.27 |
| Average tensile strength | 31.11 kgf 148.14 kgf/mm² 1453 MPa | 14.72 kgf 70.09 kgf/mm² 687 MPa | 14.037 kgf 100.26 kgf/mm² 983 MPa | 7.903 kgf 56.45 kgf/mm² 554 MPa |
| Grain size | 15-20 nm | 0.1-10 μm | 15-20 nm | 0.1-10 μm |

The alloy metal foil substrate material formed by electroforming is a nanocrystal line material having high mechanical properties compared, to a general bulk material having the same composition. However, it shows a rapid change in the thermal expansion behavior due to a change in the structure at a specific temperature. This rapid change can be problematic in a process of depositing CIGS at high temperature. To overcome this problem, in the present invention, the structure stabilization process was performed. The metal foil substrate material subjected to the structure stabilization process showed a stabile thermal expansion behavior even at varying temperatures, as can be seen in FIGS. 3 and 4.

In addition, as can be seen in Table 1 above, when the alloy metal foil substrate material was subjected to the structure stabilization process, the grain size (10-30 nm) of the substrate material increased to a grain size of 0.1-10 μm. As the grain size of the substrate material increases, the tensile strength thereof decreases, but the flexibility thereof increases, suggesting that the substrate material can be advantageously used for a flexible CIGS solar cell.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An Fe—Ni alloy metal foil substrate material for a flexible CIGS solar cell prepared by an electroforming process, wherein the Fe—Ni alloy metal foil substrate material is composed of Fe-46 to 52 wt % Ni and has a grain size ranging from 0.1 μm to 5 μm, a thickness between 10 μm and 50 μm, and a thermal expansion coefficient ranging from $6 \times 10^{-6}/°$ C. to $12 \times 10^{-6}/°$ C., and the grain structure of the Fe—Ni alloy metal foil substrate material is formed by stabilizing the structure at a temperature between 400° C. and 600° C.

2. A method for producing an Fe—Ni alloy metal foil substrate material for a flexible CIGS solar cell, the method comprising the steps of: producing an Fe—Ni alloy metal foil which is composed of Fe-46 to 52 wt % Ni by an electroforming process using an electrode; and stabilizing the structure of the Fe—Ni metal foil by heat-treating the metal foil at a temperature between 400° C. and 600° C. for 30 minutes to 2 hours to have a grain size ranging from 0.1 μm to 5 μm.

3. The method of claim 2, wherein the width of the Fe—Ni alloy metal foil substrate material is determined by the width of the electrode.

4. The method of claim 2, wherein the thickness of the Fe—Ni alloy metal foil substrate material is controlled by the rotating speed of the electrode.

* * * * *